US008223529B2

United States Patent
Kim et al.

(10) Patent No.: US 8,223,529 B2
(45) Date of Patent: Jul. 17, 2012

(54) RESISTIVE MEMORY DEVICES, MEMORY SYSTEMS AND METHODS OF CONTROLLING INPUT AND OUTPUT OPERATIONS OF THE SAME

(75) Inventors: Ho-Jung Kim, Suwon-si (KR);
Yeong-Taek Lee, Seoul (KR);
Chul-Woo Park, Yongin-si (KR);
Sang-Beom Kang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 165 days.

(21) Appl. No.: 12/703,354

(22) Filed: Feb. 10, 2010

(65) Prior Publication Data
US 2010/0214819 A1    Aug. 26, 2010

(30) Foreign Application Priority Data

Feb. 20, 2009   (KR) ........................ 10-2009-0014187

(51) Int. Cl.
*G11C 11/00* (2006.01)
(52) U.S. Cl. ........ 365/148; 365/161; 365/163; 365/171; 365/173; 365/158; 365/191; 365/189.07; 365/210.11
(58) Field of Classification Search .................. 365/148, 365/158, 161, 163, 171, 173, 185.01–185.33, 365/191, 189.07, 210.11
See application file for complete search history.

(56) References Cited

U.S. PATENT DOCUMENTS

| | | | |
|---|---|---|---|
| 2007/0070682 A1 | 3/2007 | Nakashima et al. | |
| 2007/0236987 A1* | 10/2007 | Cho et al. ...................... | 365/163 |
| 2009/0135641 A1 | 5/2009 | Tajiri et al. | |

FOREIGN PATENT DOCUMENTS

| KR | 10-2008-0022184 A | 3/2008 |
|---|---|---|
| WO | WO 2008/012871 A1 | 1/2008 |

* cited by examiner

*Primary Examiner* — Hoai V Ho
*Assistant Examiner* — Kretelia Graham
(74) *Attorney, Agent, or Firm* — Myers Bigel Sibley & Sajovec, P.A.

(57) ABSTRACT

A resistive memory device includes a resistive memory cell array, an output circuit and an input circuit. The resistive memory cell array includes a plurality of memory cells that are coupled to bitlines. The output circuit generates a sensing output signal during a write operation by sensing a bitline voltage, and generates output data during a read operation by sensing the bitline voltage. The input circuit controls the bitline voltage based on input data for the write operation, and limits the bitline voltage in response to the sensing output signal during the write operation. The memory cells are protected by effectually limiting bitline voltage.

14 Claims, 14 Drawing Sheets

RESISTIVE MEMORY DEVICES, MEMORY SYSTEMS AND METHODS OF CONTROLLING INPUT AND OUTPUT OPERATIONS OF THE SAME

CROSS-REFERENCE TO RELATED APPLICATION(S)

This application claims priority under 35 USC §119 to Korean Patent Application No. 2009-0014187, filed on Feb. 20, 2009, in the Korean Intellectual Property Office (KIPO), the contents of which are incorporated herein in its entirety by reference.

BACKGROUND

1. Technical Field

Example embodiments relate to memory devices, and more particularly to resistive memory devices, memory systems including resistive memory devices, and methods of controlling input and output operations of resistive memory devices.

2. Description of the Related Art

Semiconductor memory devices for storing data may be classified into volatile memory devices and non-volatile memory devices. The volatile memory devices such as Dynamic Random Access Memory (DRAM) and Static Random Access Memory (SRAM) retain stored data while power is supplied and lose the stored data when power is off. The volatile memory devices are used as a main memory device in various apparatus such as computers.

The non-volatile memory devices such as flash memory devices may maintain stored data even though power is off, and are widely used for storing program codes and/or data in computers, mobile devices, etc.

According to demands for high memory capacity, high operation speed and low power consumption of the memory devices, new memory devices of various types have been developed that can realize high integration rate of DRAM, high speed of SRAM and non-volatility of flash memory in a single memory device. For example, Phase Change Random Access Memory (PRAM) using phase change materials, Resistance Random Access Memory (RRAM) using materials having variable resistance such as transition-metal oxides, and Magnetic Random Access Memory (MRAM) using ferromagnetism materials are attracting attention as memory devices of next generation. Such materials have common characteristics that resistance thereof is variable depending on magnitude and/or direction of applied voltage and/or current, and that the resistance can be maintained (that is, non-volatility) even though the applied voltage and/or current is intercepted and thus refresh operation is not required.

A memory cell of the resistive memory devices may be formed with one resistive element and one switching element so, that data may be stored by controlling voltage and/or current of a bitline and a wordline to change resistance of the resistive element.

The resistive memory cells may be classified into PRAM, RRAM, MRAM, etc. depending on materials forming the resistive element of the memory cell. For example, the resistive element of PRAM may include phase change materials such as Ge—Sb—Te, resistance of which is varied depending on temperature, the resistive element of RRAM may include a top electrode, a bottom electrode and transition-metal oxides between the top and bottom electrodes, and the resistive element of MRAM may include a magnetic top electrode, a magnetic bottom electrode and dielectric materials between the top and bottom electrodes.

SUMMARY

Some example embodiments provide a resistive memory device, capable of effectually controlling a bitline voltage during a write operation.

Some example embodiments provide a memory system including a resistive memory device.

Some example embodiments provide a method of controlling input and output operations of a resistive memory device.

According to example embodiments, a resistive memory device includes a resistive memory cell array, an output circuit and an input circuit. The resistive memory cell array includes a plurality of resistive memory cells, respective ones of which are coupled to a corresponding bitline. The output circuit generates a sensing output signal during a write operation by sensing a bitline voltage, and generates output data during a read operation by sensing the bitline voltage. The input circuit controls the bitline voltage based on input data for the write operation, and limits the bitline voltage in response to the sensing output signal during the write operation.

Each resistive memory cell may include a resistive element and a switching element coupled thereto. The resistive element may include a top electrode, a bottom electrode and transition-metal oxide between the top electrode and the bottom electrode. The resistive element may include a phase change material having a resistance that is varied depending on temperature.

The input circuit may include a protection circuit configured to limit the bitline voltage in response to the sensing output signal during the write operation.

The input circuit may be configured to limit a maximum voltage and/or a maximum time of the bitline voltage in response to the sensing output signal during the write operation.

The resistive memory device may further include a sensing reference voltage generator configured to generate a sensing reference voltage that is compared with the sensed bitline voltage by the output circuit to generate the sensing output signal.

The sensing reference voltage generator may adjust the sensing reference voltage in response to a voltage limit control signal during a reset-write operation of the write operation.

The sensing reference voltage generator may adjust the sensing reference voltage in response to a time limit control signal during a set-write operation of the write operation.

The sensing reference voltage generator may adjust the sensing reference voltage in response to a location compensation control signal for compensating deviations due to respective locations of the memory cells.

The sensing reference voltage generator may include an operational amplifier, a field effect transistor of first conductivity type such as a PMOS transistor, and a feedback circuit. The operational amplifier may have a first input terminal receiving a reference voltage and a second input terminal coupled to a feedback node. The field effect transistor of first conductivity type such as the PMOS transistor may have a first controlled terminal such as a source coupled to a first reference voltage such as a power supply voltage, a second controlled terminal such as a drain for providing the sensing reference voltage and a gate coupled to an output terminal of the operational amplifier. The feedback circuit may be coupled between a second reference voltage such as a ground voltage and the second controlled terminal such as the drain of the field effect transistor of the first conductivity type, and may adjust a voltage of the feedback node in response to a voltage limit control signal, a time limit control signal and/or a location compensation control signal.

The feedback circuit may include a plurality of resistors serially coupled to the feedback node and a plurality of field effect transistors of second conductivity type such as NMOS transistors, respectively coupled in parallel to each of the resistors. The field effect transistors of second conductivity type such as NMOS transistors may be selectively turned on in response to the voltage limit control signal, the time limit control signal and/or the location compensation control signal to control the voltage of the feedback node.

The output circuit may include a field effect transistor having a first controlled terminal coupled to the bitline and a gate receiving a read enable signal, a bitline precharge circuit coupled to a second controlled terminal of the field effect transistor, the bitline precharge circuit configured to precharge the bitline in response to a precharge control signal and to discharge the bitline in response to a discharge control signal while the read enable signal is activated, a sense amplifier configured to compare the bitline voltage with a sensing reference voltage to generate the sensing output signal, and a latch circuit configured to output an inversion signal of the sensing output signal as the output data during the read operation and to output the sensing output signal as a feedback signal during the write operation, in response to a latch control signal and a transfer control signal.

The sensing output signal may be provided to the input circuit during the write operation to limit the bitline voltage.

The input circuit may include a protection circuit having a first terminal coupled to the bitline, the protection circuit configured to limit the bitline voltage in response to the sensing output signal, a field effect transistor of the first conductivity type such as a PMOS transistor having a first controlled terminal coupled to a second terminal of the protection circuit, the field effect transistor of the first conductivity type such as the PMOS transistor configured to adjust a voltage applied to the bitline in response to a set-reset signal, a driving transistor coupled between a driving voltage and a second terminal of the field effect transistor of the first conductivity type such as a PMOS transistor, an input buffer configured to control the driving transistor in response to the input data, and an inhibition circuit configured to control a latch in the input buffer in response to a feedback signal from the output circuit to turn off the driving transistor.

The protection circuit may include a field effect transistor of second conductivity type such as NMOS transistor coupled between the bitline and the field effect transistor of first conductivity type such as the PMOS transistor, and the field effect transistor of the second conductivity type such as the NMOS transistor may turn off in response to the sensing output signal.

According to example embodiments, a memory system includes a memory controller configured to generate an address signal and command signals, and a resistive memory device configured to store data and output the stored data based on the address signal and command signals.

The resistive memory device includes a resistive memory cell array, an output circuit and an input circuit. The resistive memory cell array includes a plurality of resistive memory cells, respective ones of which are coupled to a corresponding bitline. The output circuit generates a sensing output signal during a write operation by sensing a bitline voltage, and generates output data during a read operation by sensing the bitline voltage. The input circuit controls the bitline voltage based on input data for the write operation, and limits the bitline voltage in response to the sensing output signal during the write operation.

In a method of controlling input and output operations of a resistive memory device including a plurality of resistive memory cells respectively coupled to a corresponding bitline, according to example embodiments, a sensing output signal is generated during a write operation by sensing a bitline voltage. The bitline voltage is controlled based on input data for the write operation. The bitline voltage is limited in response to the sensing output signal during the write operation. Output data is generated during a read operation by sensing the bitline voltage.

The sensing output signal may be generated by sensing the bitline voltage, by comparing the sensed bitline voltage with a sensing reference voltage to generate the sensing output signal, and by adjusting the sensing reference voltage in response to a voltage limit control signal and/or a time limit control signal.

The bitline voltage may be controlled based on input data for the write operation, by performing an initial read operation to generate a feedback signal indicating data stored in a corresponding memory cell, performing an inhibit operation based on the feedback signal, performing a reset-write operation based on a result of the inhibit operation, and performing a set-write operation based on the input data.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
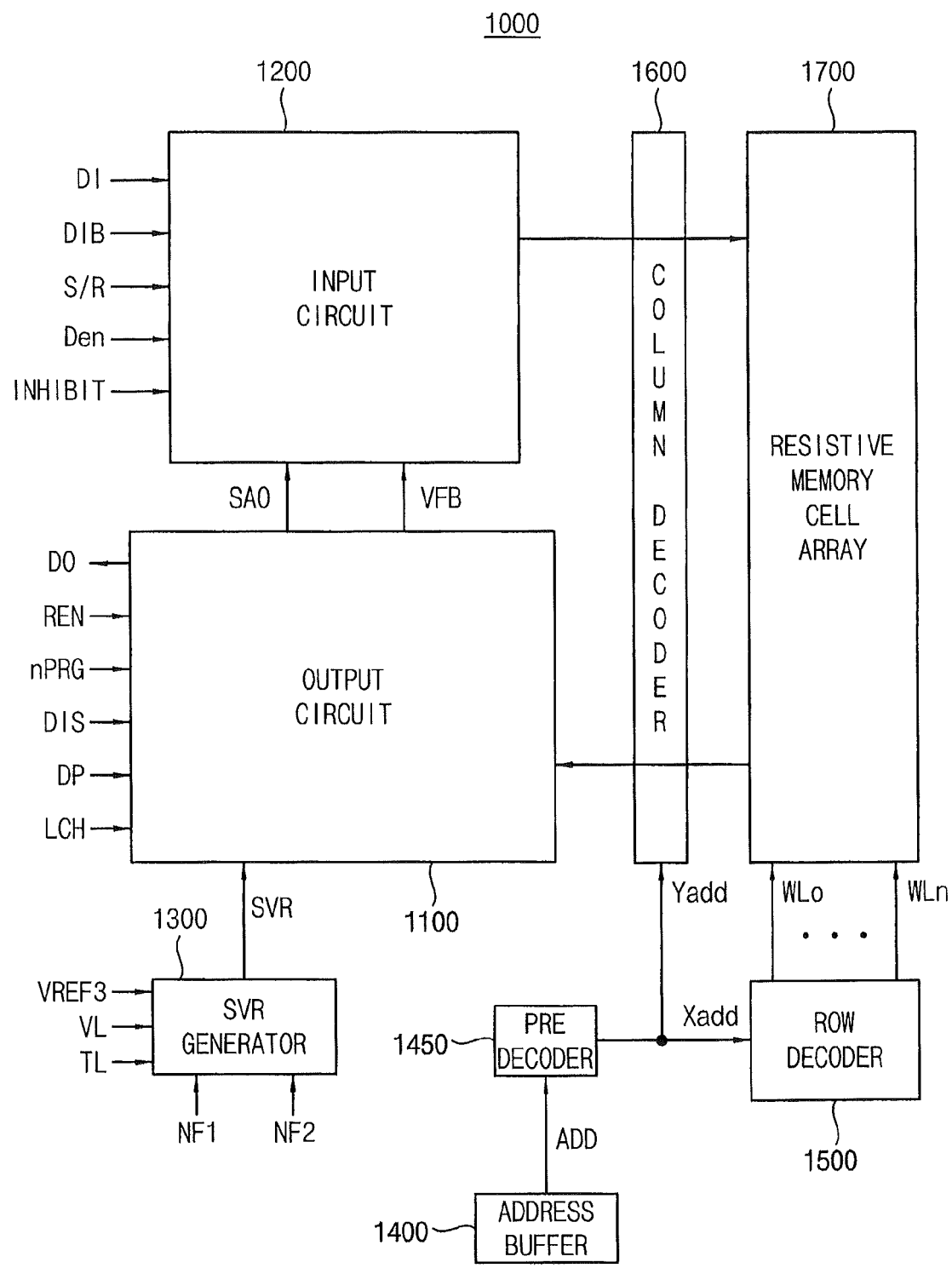
FIG. 1 is a block diagram illustrating a resistive memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout. Moreover, each embodiment described and illustrated herein includes its complementary conductivity type embodiment as well.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a resistive memory device according to example embodiments.

Referring to FIG. 1, a resistive memory device 1000 includes an output circuit 1100, an input circuit 1200, and a resistive memory cell array 1700.

The resistive memory cell array 1700 includes a plurality of resistive memory cells, respective ones of which are coupled to a corresponding bitline. The output circuit 1100 generates a sensing output signal SAO during a write operation by sensing a bitline voltage, and generates output data DO during a read operation by sensing the bitline voltage. The input circuit 1200 controls the bitline voltage based on input data DI for the write operation, and limits the bitline voltage in response to the sensing output signal SAO during the write operation.

The resistive memory device 1000 may further include a sensing voltage reference (SVR) generator 1300, an address buffer 1400, a pre-decoder 1450, a row decoder 1500 and a column decoder 1600. The sensing voltage reference generator 1300 generates a sensing voltage reference SVR having a voltage level that is varied according to various operation modes such as the write operation including a reset-write operation and a set-write operation, and the read operation. The pre-decoder 1450 generates a row address Xadd and a column address Yadd based on an address signal ADD from the address buffer 1400. The row decoder 1500 generates wordline driving signals WL0 through WLn based on the row address Xadd for selecting a row of memory cells in the resistive memory cell array 1700. The column decoder 1600 designates a bitline coupled to the memory cell, for performing the write operation or the read operation.

Figure 2:
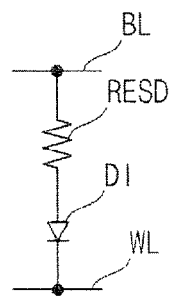
FIG. 2 is a diagram illustrating an example of a resistive memory cell of the memory cell array in FIG. 1.

FIG. 2 is a diagram illustrating an example of a resistive memory cell of the memory cell array in FIG. 1.

Referring to FIG. 2, a memory cell may include a resistive element RESD and a diode D1 serially coupled between a bitline BL and a wordline WL. The memory cell of FIG. 2 may determine a resistance distribution of the resistive element RESD by controlling voltages applied to the bitline BL and the wordline WL. The write operation may be performed by applying the voltages to the bitline BL and the wordline WL, thereby controlling a voltage difference between both ends of the resistive element RESD or controlling a current flowing through the resistive element RESD.

Figure 3:
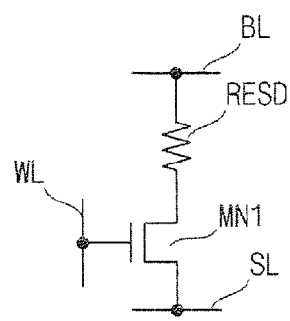
FIG. 3 is a diagram illustrating another example of a resistive memory cell of the memory cell array in FIG. 1.

FIG. 3 is a diagram illustrating another example of a resistive memory cell of the memory cell array in FIG. 1.

Referring to FIG. 3, a memory cell may include a resistive element RESD and a switching element such as a transistor MN1 serially coupled between a bitline BL and a source line SL. A gate of the transistor MN1 is coupled to a wordline WL. The memory cell of FIG. 3 may determine a resistance distribution of the resistive element RESD by controlling voltages applied to the bitline BL and the source line SL. The write operation may be performed by applying the voltages to the bitline BL and the source line SL, thereby controlling a voltage difference between both ends of the resistive element RESD or controlling a current flowing through the resistive element RESD.

Figure 4:
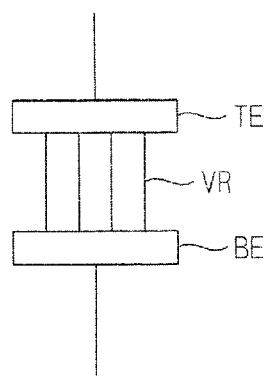
FIG. 4 is a diagram illustrating an example of a resistive element in the resistive memory cell of FIGS. 2 and 3.

FIG. 4 is a diagram illustrating an example of a resistive element in the resistive memory cell of FIGS. 2 and 3.

Referring to FIG. 4, a resistive element RESD1 may include a top electrode TE, a bottom electrode BE and resistive material between the electrodes TE and BE. The electrodes TE and BE may be formed with metal such as tantalum (Ta), platinum (Pt), etc. The resistive material may include transition-metal oxide (VR) such as cobalt oxide.

Figure 5:
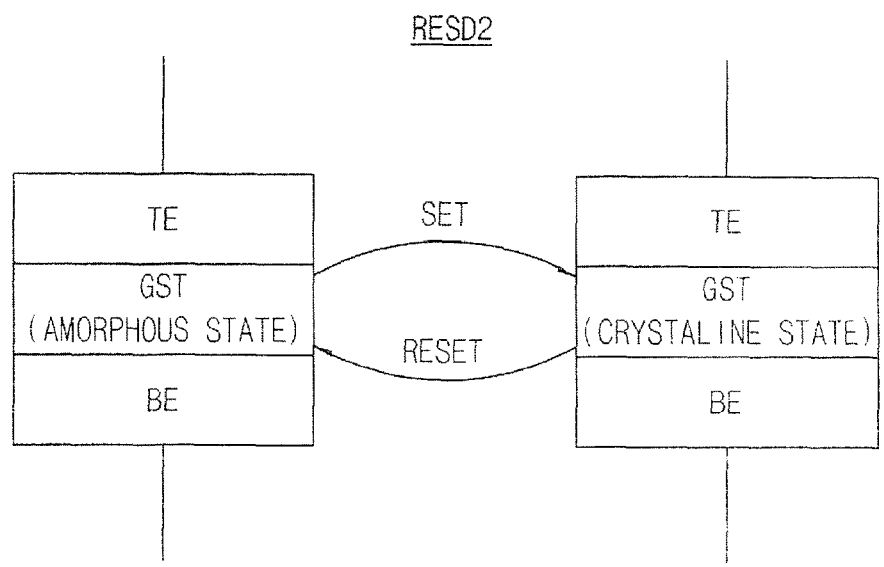
FIG. 5 is a diagram illustrating another example of a resistive element in the resistive memory cell of FIGS. 2 and 3.

FIG. 5 is a diagram illustrating another example of a resistive element in the resistive memory cell of FIGS. 2 and 3.

Referring to FIG. 5, a resistive element RESD2 may include a top electrode TE, a bottom electrode BE and resistive material between the electrodes TE and BE. The electrodes TE and BE may be formed with metal such as tantalum (Ta), platinum (Pt), etc. The resistive material may include phase change material such as GeSbTe (GST). The phase change material may be in amorphous state of relatively high resistance or in crystalline state of relatively low resistance depending on heating time and/or heating temperature, and thus the phase change material may change its resistance according to phase change.

Figure 6:
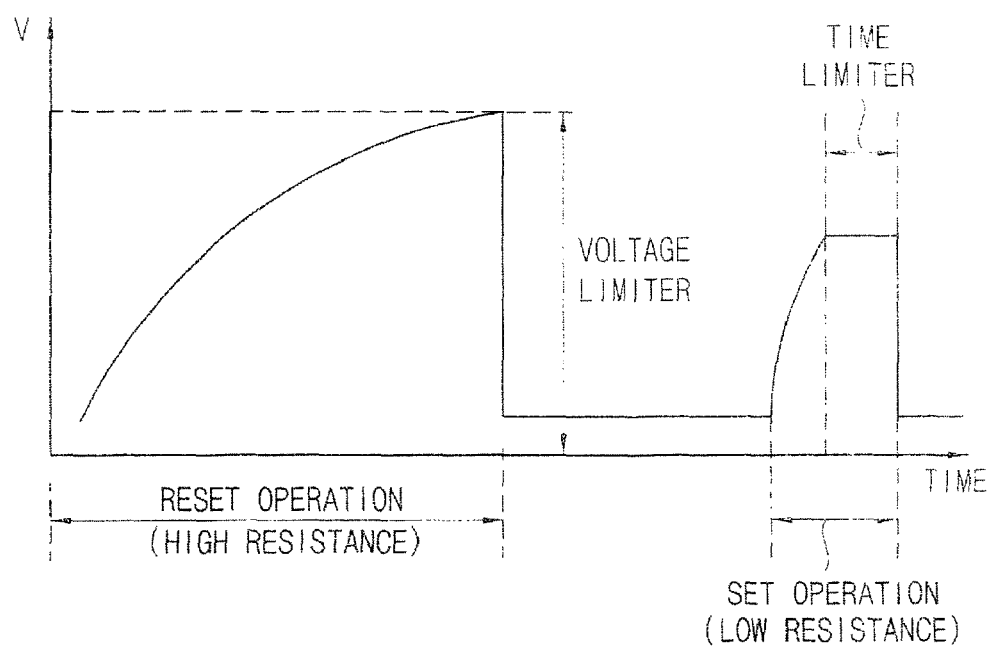
FIG. 6 is a diagram illustrating a voltage applied to a resistive memory cell including the resistive element of FIG. 4.

FIG. 6 is a diagram illustrating a voltage applied to a resistive memory cell including the resistive element of FIG. 4.

For example, the voltage illustrated in FIG. 6 may be a bitline voltage for applying a voltage difference between both ends of a memory cell. Referring to FIG. 6, the bitline voltage has different waveforms during the reset operation and the set operation. As illustrated in FIG. 6, a reset operation may be defined as changing a state of a memory cell from the crystalline state of relatively low resistance to the amorphous state of relatively high resistance, and a set operation may be defined as changing a state of a memory cell from the amorphous state of relatively high resistance to the crystalline state of relatively low resistance. On the contrary, a reset operation may be defined as changing a state of a memory cell from the amorphous state of relatively high resistance to the crystalline state of relatively low resistance, and a set operation may be defined as changing a state of a memory cell from the crystalline state of relatively low resistance to the amorphous state of relatively high resistance.

As will be described later, voltage limiting is applied during the reset operation and time limiting is applied during the set operation according to example embodiments.

Figure 7:
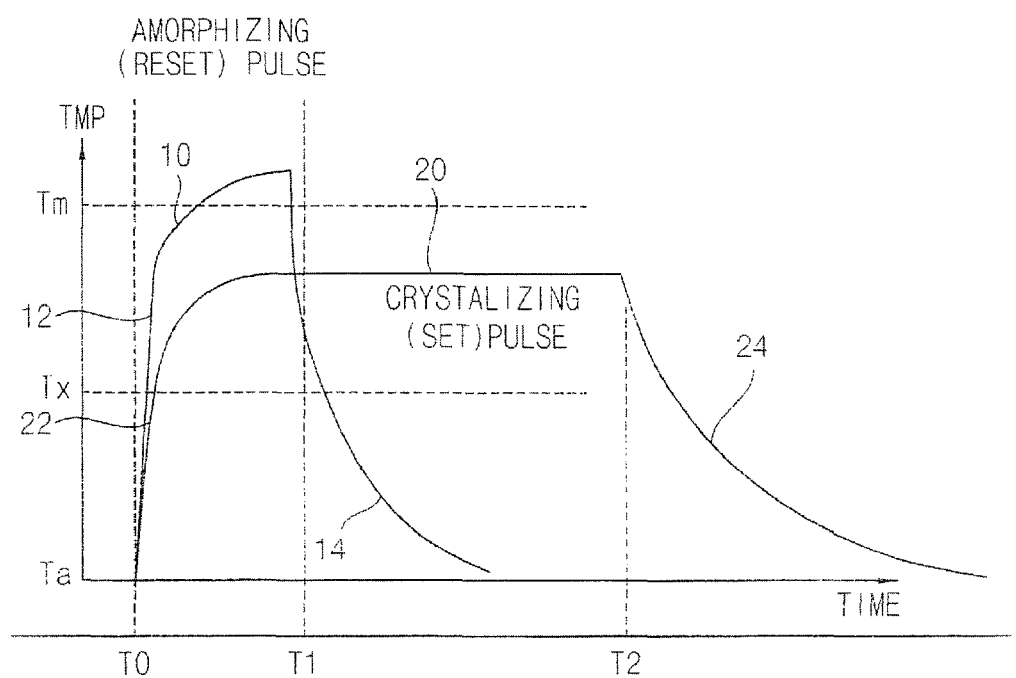
FIG. 7 is a diagram illustrating a phase change characteristic of the resistive element of FIG. 5.

FIG. 7 is a diagram illustrating a phase change characteristic of the resistive element of FIG. 5. In FIG. 7, the horizontal axis represents a time (TIME) and the vertical axis represents a temperature (TMP).

Referring to FIG. 7, waveforms 12, 10 and 14 indicate temperature change by applying an amorphizing (reset) pulse, and waveforms 22, 20 and 24 indicate temperature change by applying a crystallizing (set) pulse. The amorphous state of phase change material (GST) may be obtained by heating the GST with a temperature over a melting temperature Tm and then rapidly cooling the GST. The crystalline state of phase change material (GST) may be obtained by heating the GST with a temperature over a crystallization temperature Tx and then cooling the GST. Hereinafter, a reset-write operation or a reset operation is defined as changing the state of the resistive element of FIG. 5 from the crystalline state to the amorphous state, and a set-write operation or a set operation is defined as changing the state from the amorphous state to the crystalline state.

Figure 8:
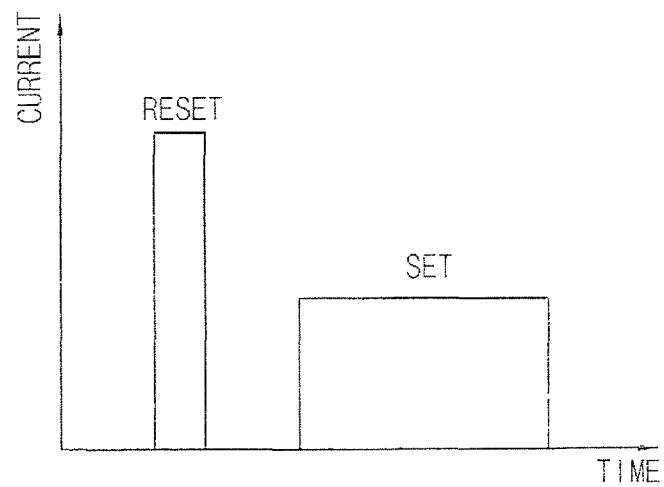
FIG. 8 is a diagram illustrating current pulses applied to a resistive memory cell including the resistive element of FIG. 5, for controlling the phase change characteristic of the resistive element of FIG. 5.

FIG. 8 is a diagram illustrating current pulses applied to a resistive memory cell including the resistive element of FIG. 5, for controlling the phase change characteristic of the resistive element of FIG. 5. In FIG. 8, the horizontal axis represents a time (TIME) and the vertical axis represents a current (CURRENT).

Referring to FIG. 8, a current level of a reset pulse RESET for performing the reset-write operation is higher than a current level of a set pulse SET for performing the set-write operation, and a pulse width of the reset pulse RESET is shorter than a pulse width of the set pulse SET. The reset pulse RESET and the set pulse SET represent current pulses applied for writing a data value "1" or "0" into a memory cell.

Figure 9:
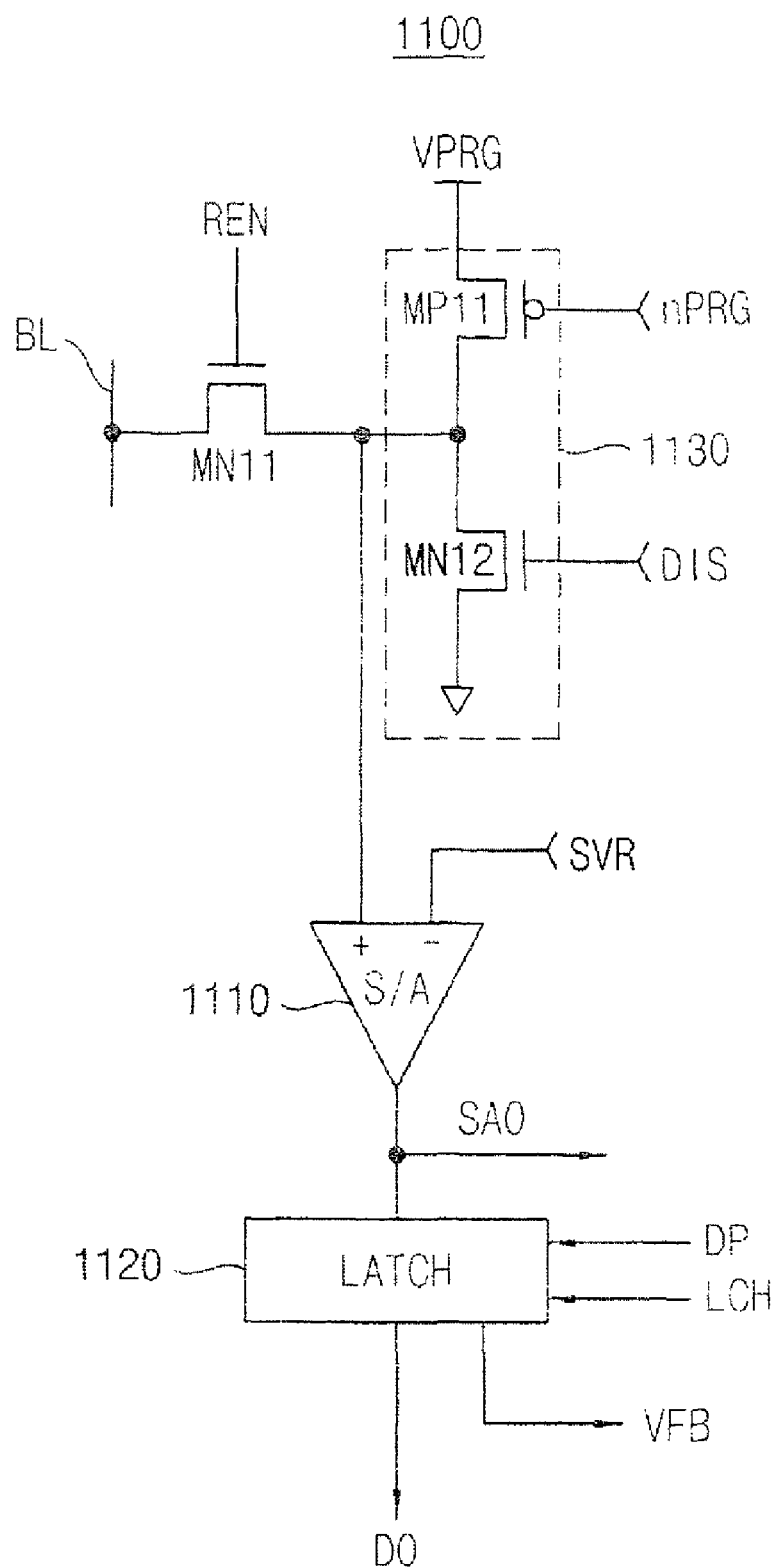
FIG. 9 is a circuit diagram illustrating an example of an output circuit in the resistive memory device of FIG. 1.

FIG. 9 is a circuit diagram illustrating an example of an output circuit 1100 in the resistive memory device of FIG. 1.

Referring to FIG. 9, an output circuit 1100 includes a transistor MN11, a sense amplifier 1110, a latch circuit 1120 and a bitline precharge circuit 1130.

The transistor MN11 connects the bitline precharge circuit 1130 to the bitline BL in response to a read enable signal REN. A first controlled terminal (source or drain) of the transistor MN11 is coupled to the bitline and a second controlled terminal (drain or source) of the transistor MN11 is coupled to the bitline precharge circuit 1130. The bitline precharge circuit 1130 precharges the bitline BL in response to a precharge control signal nPRG and discharges the bitline BL in response to a discharge control signal DIS while the read enable signal REN is activated. The sense amplifier 1110 compares the bitline voltage provided through the transistor MN11 with a sensing voltage reference SVR to generate the sensing output signal SAO. The latch circuit 1120 outputs an inversion signal of the sensing output signal SAO as the output data DO during the read operation and outputs the sensing output signal SAO as a feedback signal VFB during the write operation, in response to a latch control signal LCH and a transfer control signal DP. The sensing output signal SAO is provided to the input circuit 1200 of FIG. 1 during the write operation to limit the bitline voltage.

The bitline precharge circuit 1130 may include a field effect transistor of first conductivity type such as a p-channel metal-oxide semiconductor (PMOS) transistor MP11 and a field effect transistor of second conductivity type such as an n-channel metal-oxide semiconductor (NMOS) transistor MN12. The PMOS transistor MP11 has a first controlled terminal such as a source receiving a precharge voltage VPRG, a gate receiving the precharge control signal nPRG, and a second controlled terminal such as a drain coupled to the NMOS transistor MN12. The NMOS transistor MN12 has a first controlled terminal such as a source coupled to a second reference voltage such as ground, a gate receiving the discharge control signal DIS, and a second controlled terminal such as a drain coupled to the PMOS transistor.

Figure 10:
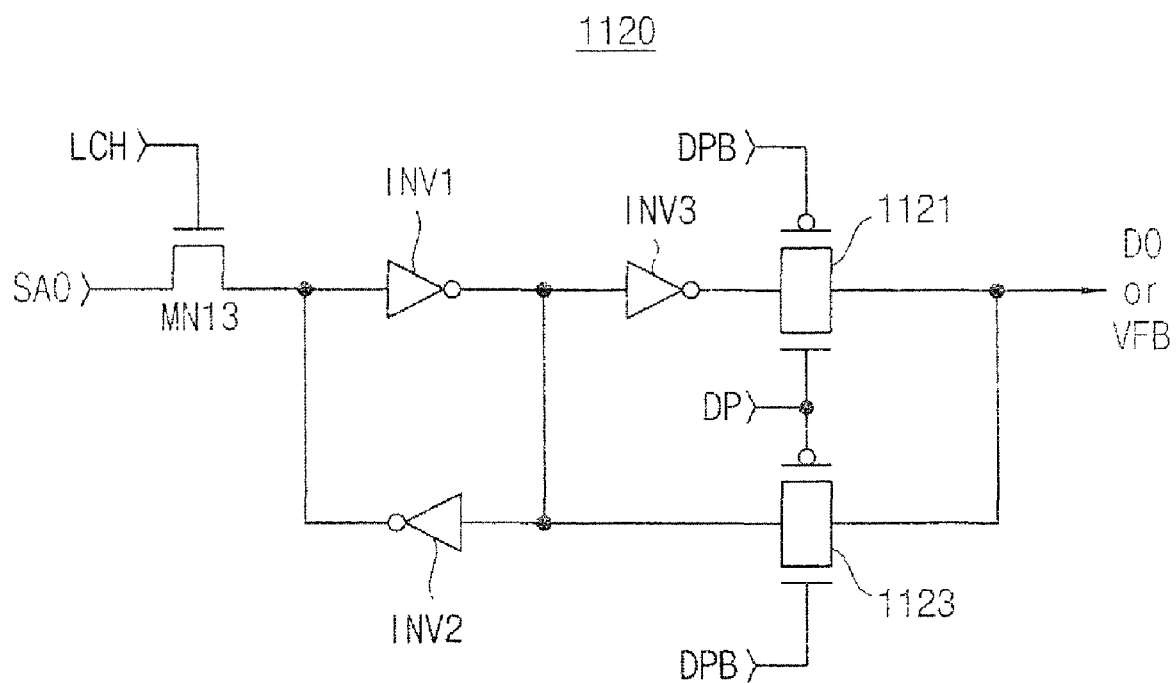
FIG. 10 is a circuit diagram illustrating an example of a latch circuit in the output circuit of FIG. 9.

FIG. 10 is a circuit diagram illustrating an example of a latch circuit in the output circuit of FIG. 9.

Referring to FIG. 10, a latch circuit 1120 includes a field effect transistor of second conductivity type such as an NMOS transistor MN13, a first inverter INV1, a second inverter INV2, a third inverter INV3, a first transmission gate 1121 and a second transmission gate 1123.

The NMOS transistor MN13 has a second controlled terminal such as a drain receiving the sensing output signal SAO, a gate receiving a latch control signal LCH, and a first controlled terminal such as a source coupled to an input terminal of the first inverter INV1. The input terminal of the first inverter INV1 is coupled to an output terminal of the second inverter INV2, and an output terminal of the first inverter INV1 is coupled to an input terminal of the second inverter INV2. An input terminal of the third inverter INV3 is coupled to the output terminal of the first inverter INV1. The first transmission gate 1121 transfers the output of the third inverter INV3 as the output signal DO during the read operation in response to a transfer control signal DP and an inverted transfer control signal DPB. The second transmission gate 1123 transfers the output of the first inverter INV1 as the feedback signal VFB during the write operation in response to the transfer control signal DP and the inverted transfer control signal DPB.

Accordingly, the latch circuit 1120 outputs the sensing output signal SAO as the output signal DO when the transfer control signal DP has a logic high level, and outputs the inversion signal of the sensing output signal SAO as the feedback signal VFB when the transfer control signal DP has a logic low level. In the embodiments of FIGS. 9 and 10, the transfer control signal has the logic high level during the read operation and has the logic low level during the write operation.

Figure 11:
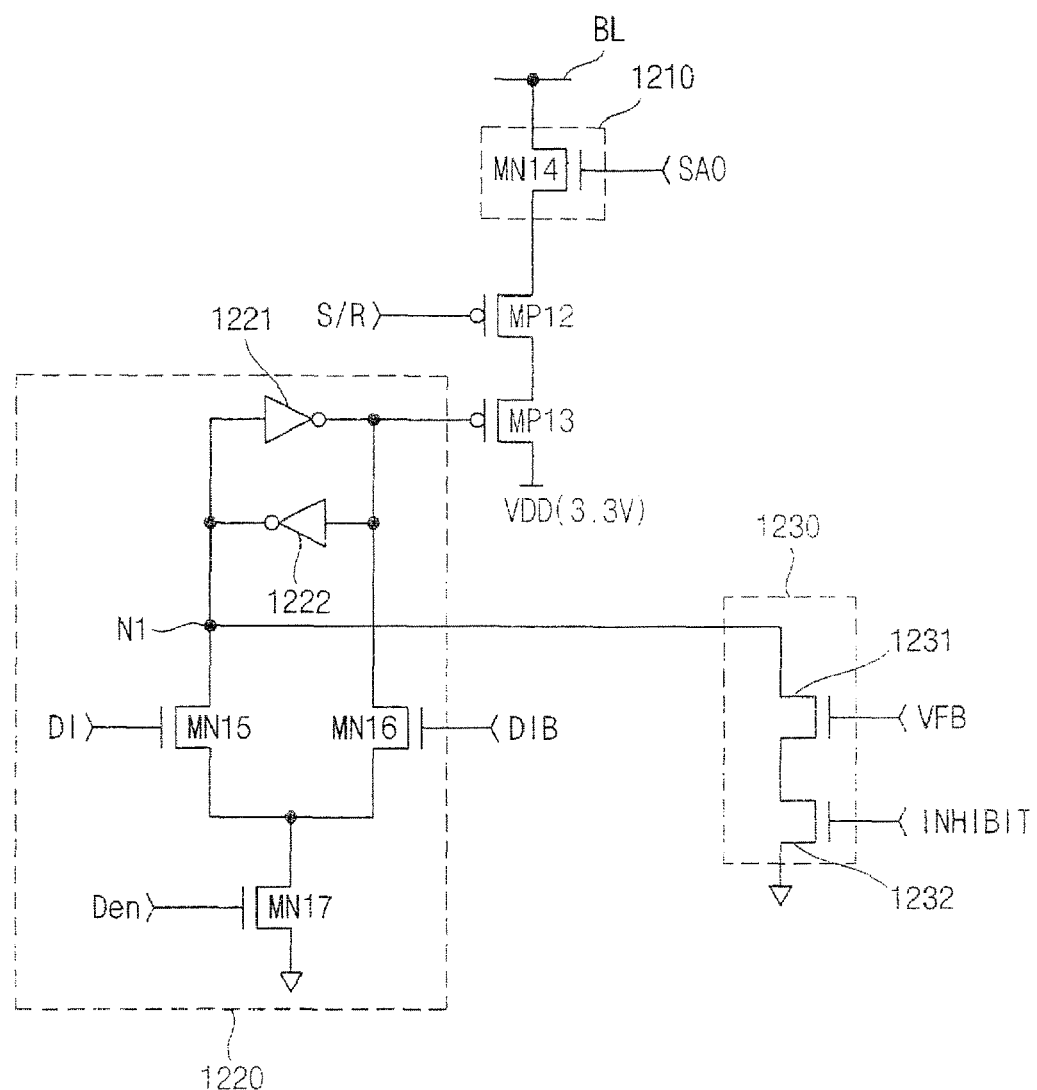
FIG. 11 is a circuit diagram illustrating an example of an input circuit in the resistive memory device of FIG. 1.

FIG. 11 is a circuit diagram illustrating an example of an input circuit in the resistive memory device of FIG. 1.

Referring to FIG. 11, an input circuit 1200 includes a protection circuit 1210, an input buffer 1220, an inhibition circuit 1230, a field effect transistor of first conductivity type such as a PMOS transistor MP12 and a driving transistor MP13.

The protection circuit 1210 has a first terminal coupled to the bitline BL, and the protection circuit 1210 limits the bitline voltage in response to the sensing output signal SAO. The PMOS transistor MP12 has a first controlled terminal coupled to a second terminal of the protection circuit 1210, and the PMOS transistor MP12 adjusts a voltage applied to the bitline in response to a set-reset signal S/R, for performing the reset-write operation or the set-write operation with respect to a memory cell coupled to the bitline BL. The driving transistor MP13 is coupled between a first reference voltage such as a power supply voltage, also referred as a driving voltage VDD, and a second controlled terminal of the PMOS transistor MP12. For example, the driving voltage VDD may be about 3.3 V. The input buffer 1220 controls the driving transistor MP13 in response to the input data DI. The inhibition circuit 1230 controls a latch 1221 and 1222 in the input buffer 1220 in response to a feedback signal VFB from the output circuit 1110 of FIG. 9 to turn off the driving transistor MP13. The timing of the operation of the inhibition circuit 1230 may be controlled in response to an inhibition control signal INHIBIT. For example, when the feedback signal VFB is logic high level and the inhibition control signal is logic high level, a node N1 is set to logic low level. In this case, since the driving transistor MP13 is turned off, the driving voltage VDD is disconnected from the bitline BL. As such, the inhibition operation may be performed to prevent the unnecessary reset-write operation with respect to the memory cells that are already in the amorphous state of relatively high resistance.

The input buffer 1220 may include a fourth inverter 1221, a fifth inverter 1222, a first field effect transistor of second conductivity type such as a first NMOS transistor MN15, a second field effect transistor of the second conductivity type such as a second NMOS transistor MN16 and a third field effect transistor of the second conductivity type such as a third NMOS transistor MN17.

The third NMOS transistor MN17 has a first controlled terminal such as a source coupled to a second reference voltage such as ground, and a gate receiving a data enable signal Den. The first NMOS transistor MN15 has a first controlled terminal such as a source coupled to a second controlled terminal such as a drain of the third NMOS transistor MN 17, and a gate receiving an input data DI. The second NMOS transistor MN 16 has a first controlled terminal such as a source coupled to the second controlled terminal such as a drain of the third NMOS transistor MN17, and a gate receiving an inverted input data DIB.

The fourth inverter 1221 has an input terminal coupled to a second controlled terminal such as a drain of the first NMOS transistor MN15, and an output terminal coupled to a second controlled terminal such as a drain of the second NMOS transistor MN16. The fifth inverter 1222 has an input terminal coupled to the second controlled terminal such as a drain of the second NMOS transistor MN16, and an output terminal coupled to the second controlled terminal such as a drain of the first NMOS transistor MN15. That is, the input terminal of the fourth inverter 1221 and the output terminal of the fifth inverter 1222 are commonly coupled to the node N1 that is coupled to the inhibition circuit 1230. The output terminal of the fourth inverter 1221 and the input terminal of the fifth inverter 1222 are commonly coupled to the gate of the driving transistor MP13.

The inhibition circuit 1230 may include a fourth field effect transistor of the second conductivity type such as a fourth NMOS transistor 1231 and a fifth field effect transistor of the second conductivity type such as a fifth NMOS transistor 1232 that are serially coupled. The fourth NMOS transistor 1231 is controlled by the feedback signal VFB, and the fifth NMOS transistor 1232 is controlled by the inhibition control signal INHIBIT. The second reference voltage such as ground voltage is applied to a second controlled terminal such as a drain of the fifth NMOS transistor 1232 and a first controlled terminal such as a source of the fourth NMOS transistor 1231 is coupled to the node N1 of the input buffer 1220.

As illustrated in FIG. 11, the protection circuit 1210 includes a field effect transistor of the second conductivity type such as an NMOS transistor MN14 coupled between the bitline BL and the field effect transistor of the first conductivity type such as the PMOS transistor MP12. At the timing when the sensing output signal SAO is deactivated to logic low level, the NMOS transistor MN14 is turned off to disconnect the bitline BL from the driving voltage VDD. As described with reference FIG. 9, the sensing output signal SAO is generated by comparing the bitline voltage and the sensing voltage reference SVR. Accordingly, the bitline voltage may be appropriately limited to protect the memory cell coupled to the bitline BL by controlling the sensing voltage reference SVR in the output circuit 1100.

When both of the inhibit control signal INHIBIT and the feedback signal are activated to logic high level, the node N1 is set to logic low level, and thus the driving transistor MP13 is turned off to disconnect the bitline BL from the driving voltage VDD. As such, the inhibition operation may be performed to prevent unnecessary reset-write operation when the feedback signal VFB indicates that the memory cell coupled to the bitline BL is already in the reset state.

Figure 12:
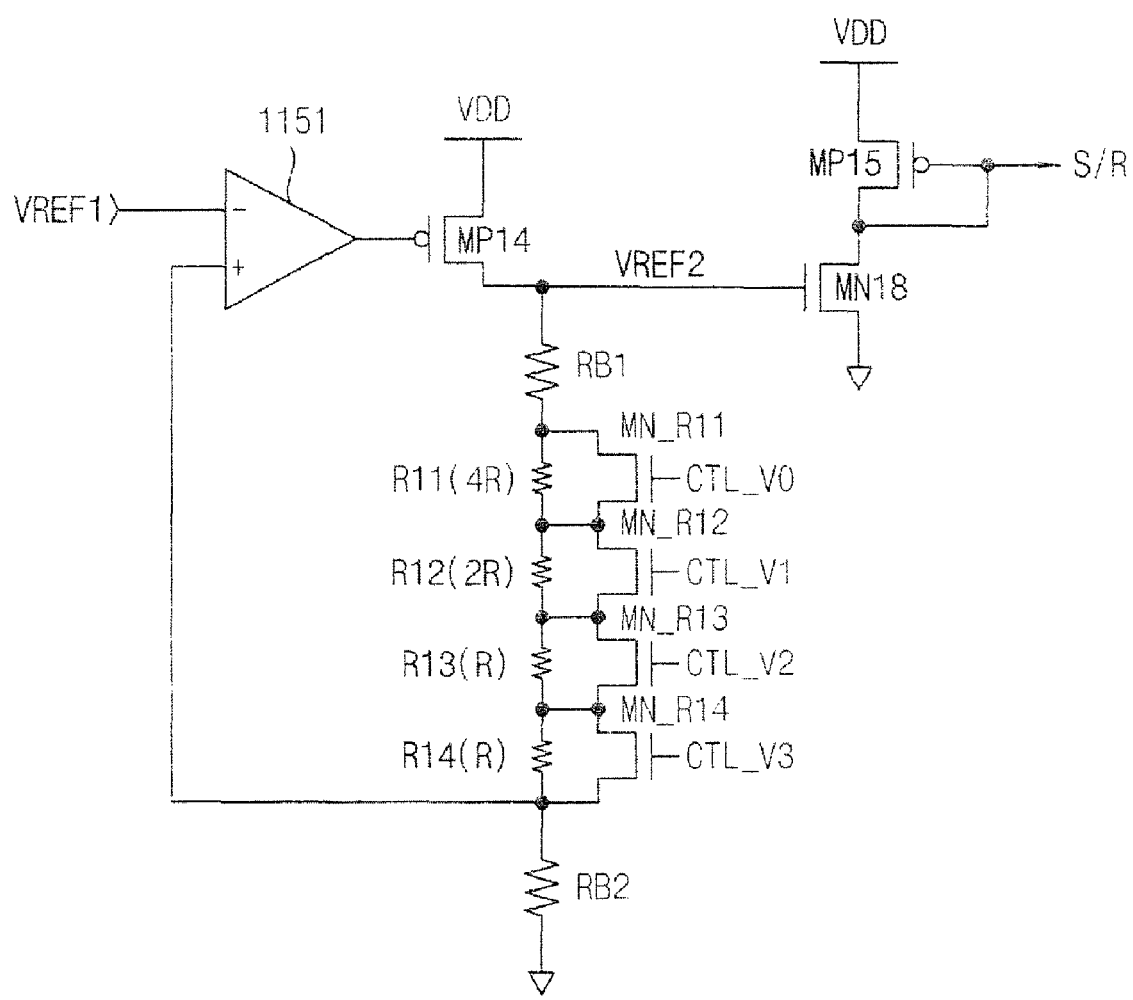
FIG. 12 is a circuit diagram illustrating an example of a set-reset signal generator for generating a set-reset signal that is input to the input circuit of FIG. 11.

FIG. 12 is a circuit diagram illustrating an example of a set-reset signal generator for generating a set-reset signal that is input to the input circuit of FIG. 11.

Referring to FIG. 12, the set-reset signal generator 1150 includes an operational amplifier 1151, a first field effect transistor of first conductivity type such as a PMOS transistor MP14, a second field effect transistor of first conductivity type such as a second PMOS transistor MP15, a field effect transistor of second conductivity type such as an NMOS transistor MN18, a first reference resistor RB1, a second reference resistor RB2, a plurality of resistors R11, R12, R13 and R14, and a plurality of field effect transistors of second conductivity type such as NMOS transistors MN_R11, MN_R12, MN_R13 and MN_R14 respectively coupled in parallel to each of the resistors R11, R12, R13 and R14.

The operational amplifier 1151 has an inversion input terminal (−) receiving a first reference voltage VREF1 and a non-inversion input terminal (+) receiving a feedback voltage. The first PMOS transistor MP14 has a first controlled terminal such as a source receiving a power supply (reference) voltage VDD, a gate coupled to an output terminal of the operational amplifier 1151, and a second controlled terminal such as a drain for generating a second reference voltage VREF2. The second PMOS transistor MP15 is diode-coupled, and has a first controlled terminal such as a source receiving the power supply (reference) voltage VDD, and a gate receiving the set-reset signal SIR. The NMOS transistor MN18 has a first controlled terminal such as a source coupled to ground, a gate receiving the second reference voltage VREF2 and a second controlled terminal such as a drain coupled to a second controlled terminal such as a drain of the second PMOS transistor MP15.

The set-reset signal generator 1150 includes the feedback circuit including the resistors RB1, RB2, R11, R12, R13 and R14, and the operational amplifier 1151 to stabilize the set-reset signal S/R. The resistors R11, R12, R13 and R14, and the field effect transistors of second conductivity type such as an NMOS transistors MN_R11, MN_R12, MN_R13 and MN_R14 respectively coupled in parallel to each of the resistors R11, R12, R13 and R14 are used to adjust the second reference voltage VREF2 in response to a reference voltage control signal CTL_V. For example, the reference voltage control signal may include four bits CTL_V0, CTL_V1, CTL_V2 and CTL_V3.

Figure 13:
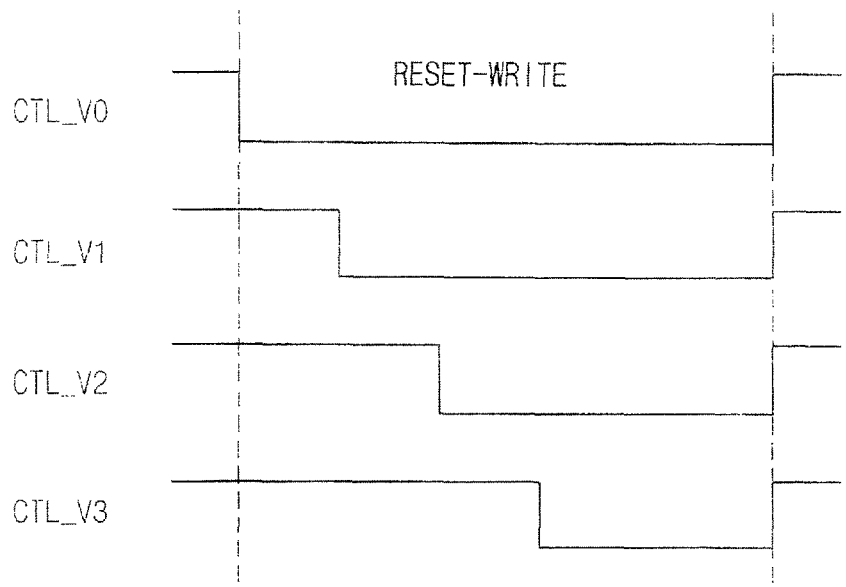
FIG. 13 is a diagram illustrating an example of a reference voltage control signal that is input to the set-reset signal generator of FIG. 12 during a reset-write operation.
Figure 14:
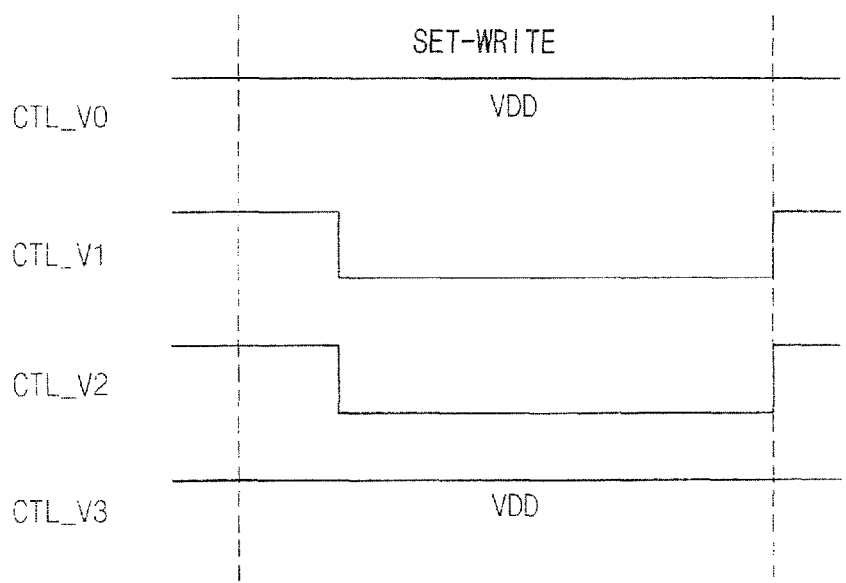
FIG. 14 is a diagram illustrating an example of a reference voltage control signal that is input to the set-reset signal generator of FIG. 12 during a set-write operation.

FIG. 13 is a diagram illustrating an example of a reference voltage control signal that is input to the set-reset signal generator of FIG. 12 during a reset-write operation, and FIG. 14 is a diagram illustrating an example of a reference voltage control signal that is input to the set-reset signal generator of FIG. 12 during a set-write operation.

Referring to FIG. 13, during the reset-write operation, the bits CTL_V0, CTL_V1, CTL_V2 and CTL_V3 of the reference voltage control signal are sequentially deactivated to logic low level.

Referring to FIG. 14, during the set-write operation, the first and fourth bits CTL_V0 and CTL_V3 of the reference voltage control signal has logic high level of VDD, and the second and third bits CTL_V1 and CTL_V2 of the reference voltage control signal has logic low level.

Figure 15:
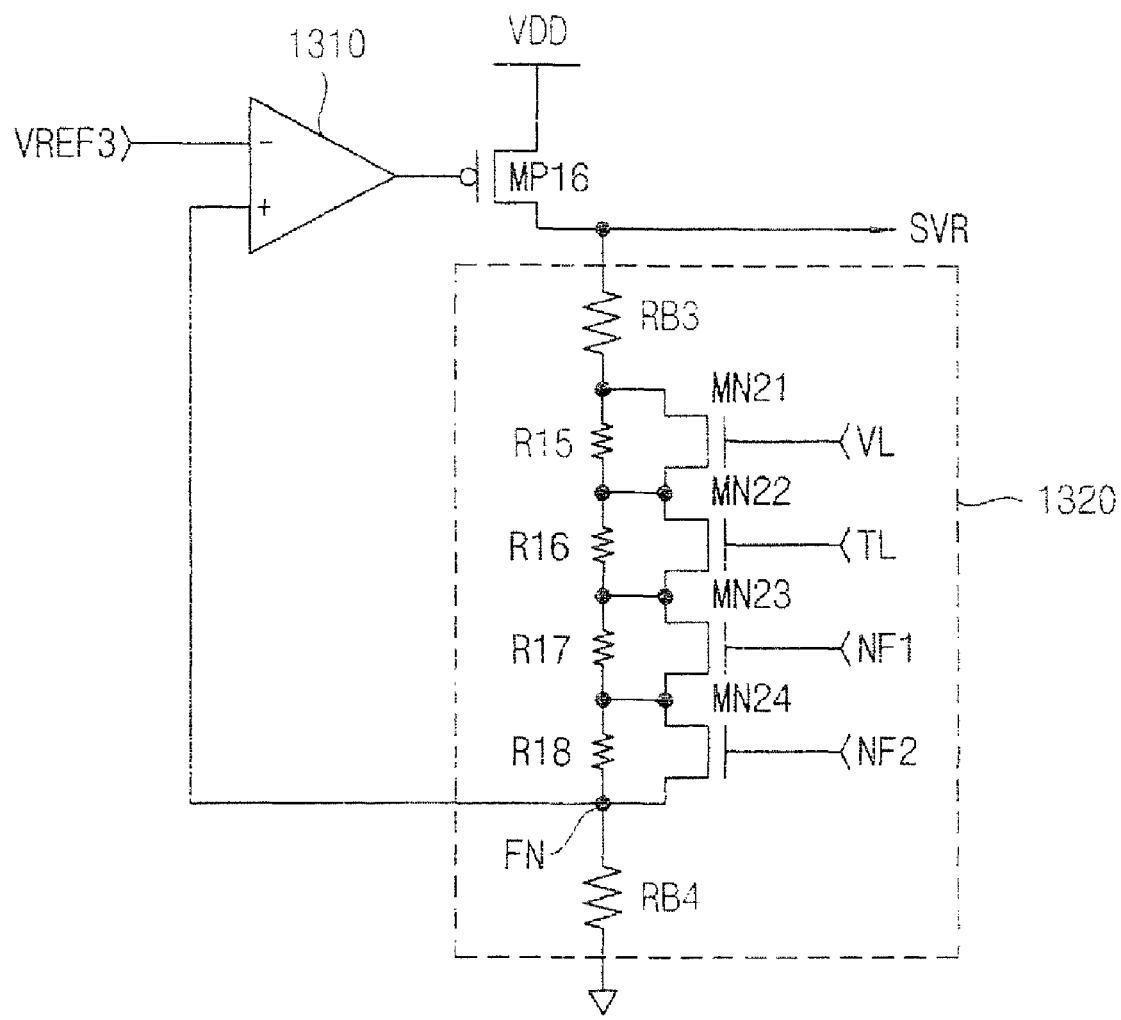
FIG. 15 is a circuit diagram illustrating an example of a sensing reference voltage generator in the resistive memory device of FIG. 1.

FIG. 15 is a circuit diagram illustrating an example of a sensing voltage reference generator in the resistive memory device of FIG. 1.

Referring to FIG. 15, the sensing voltage reference generator 1300 may include an operational amplifier 1310, a field effect transistor of first conductivity type such as a PMOS transistor MP16 and a feedback circuit 1320. The feedback circuit 1320 may include a first reference resistor RB3, a second reference resistor RB4, a plurality of resistors R15, R16, R17 and R18, and a plurality of field effect transistors of second conductivity type such as an NMOS transistors MN21, MN22, MN23 and MN24 respectively coupled in parallel to each of the resistors R15, R16, R17 and R18.

The operational amplifier 1310 has a first input terminal (−) receiving a reference voltage VREF3 and a second input terminal (+) coupled to a feedback node FN. The PMOS transistor MP16 has a source coupled to a power supply (reference) voltage VDD, a drain for providing the sensing reference voltage SVR and a gate coupled to an output terminal of the operational amplifier 1310.

The sensing voltage reference generator 1300 includes the feedback circuit 1320 including the resistors RB3, RB4, R15, R16, R17 and R18, and the operational amplifier 1310 to stabilize the sensing reference voltage SVR. The resistors R15, R16, R17 and R18, and the NMOS transistors MN21, MN22, MN23 and MN24 respectively coupled in parallel to each of the resistors R15, R16, R17 and R18 are used to adjust the sensing voltage reference SVR in response to a voltage limit control signal VL, a time limit control signal TL and/or a location compensation control signal NF1 and NF2. The NMOS transistors are selectively turned on in response to the control signals VL, TL, NF1 and NF2 to control the voltage of the feedback node FN.

Referring to FIGS. 6 and 15, the voltage limit control signal VL may be used for the reset-write operation and the time limit control signal TL may be used for the set-write operation. In addition, the location compensation control signal NF1 and NF2 may be used to adjust the sensing voltage reference SVR for compensating deviations due to respective locations of the memory cells on the wafer. The sensing output signal SAO may be controlled by adjusting the sensing reference voltage SVR in response to the location compensation control signal NF1 and NF2 depending on the distance between the memory cell and the sensing reference voltage generator 1300, and thus the bitline voltage may be limited in response to the sensing output signal SAO.

Figure 16:
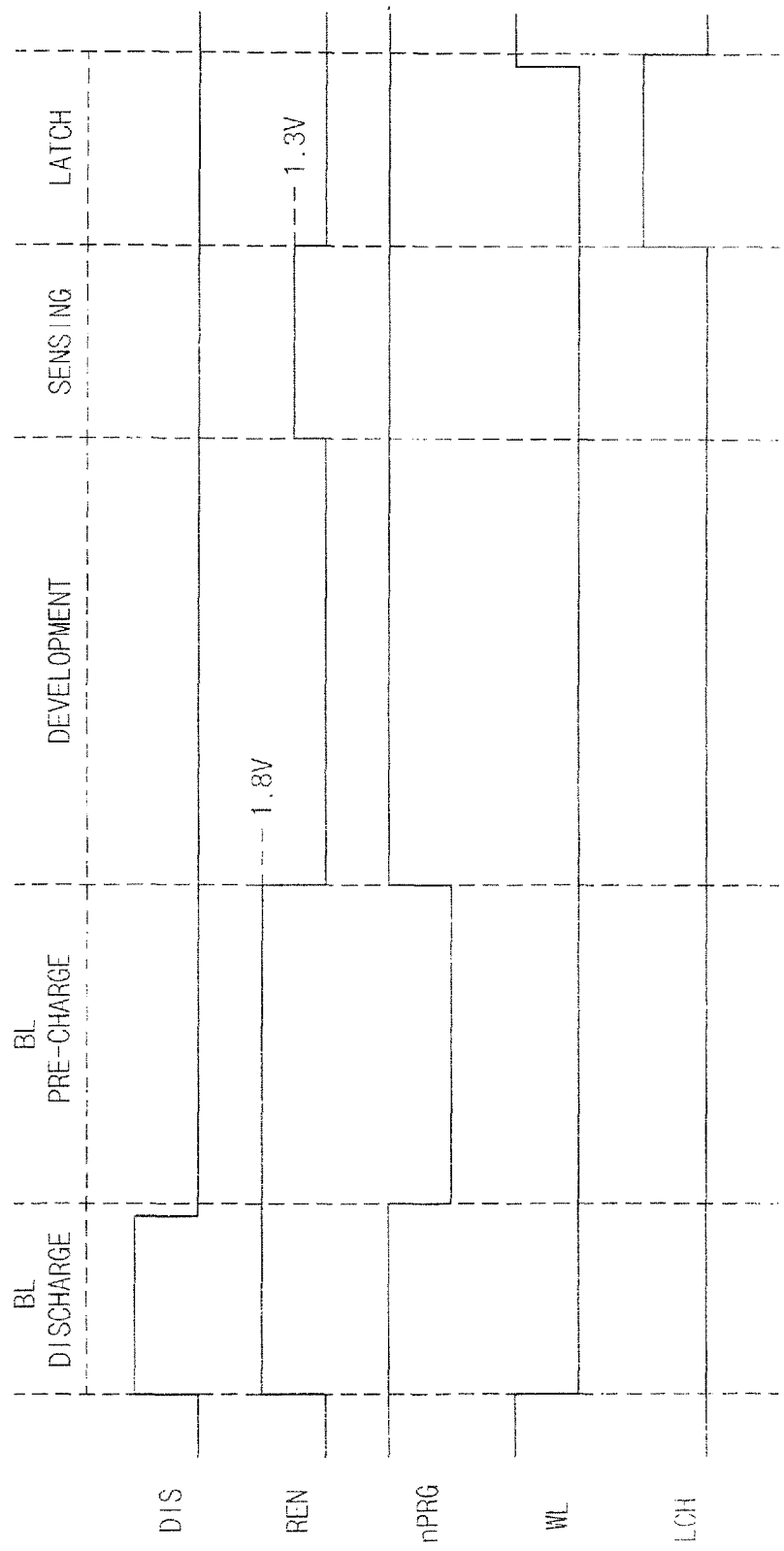
FIG. 16 is a timing diagram illustrating a read operation of the resistive memory device of FIG. 1.

FIG. 16 is a timing diagram illustrating a read operation of the resistive memory device of FIG. 1.

Referring to FIGS. 9 and 16, during a bitline discharge period, the bitline BL is discharged in response to the discharge control signal DIS. During the bitline discharge period, the discharge control signal DIS and the read enable signal REN are activated in logic high level, the precharge control signal nPRG is deactivated in logic high level, the wordline driving signal WL and the latch control signal LCH are deactivated in logic low level.

During a bitline precharge period, the bitline BL is precharged with the precharge voltage VPRG in response to the precharge control signal nPRG. During the bitline precharge period, the discharge control signal DIS is deactivated in logic low level, the read enable signal REN is activated in logic high level, the precharge control signal nPRG is activated in logic low level, the wordline driving signal WL and the latch control signal LCH are deactivated in logic low level.

During a development period, a voltage read from the memory cell is developed to the bitline BL. During the development period, the discharge control signal DIS, the read enable signal and REN the precharge control signal nPRG are deactivated.

During a sensing period, the bitline voltage is sensed by the sense amplifier 1110 to detect the state of the memory cell coupled to the bitline BL. The development speed is different depending on the state (that is, the resistance) of the memory cell, thus the bitline voltage after the development period reflects the state of the memory cell. The read enable signal REN may have a lower level during the sensing period than during the bitline precharge period. For example, the read enable signal REN may have a level of about 1.8V during the bitline precharge period and a level of about 1.3V during the sensing period.

During a latch period, the latch control signal LCH is activated in logic high level, and the sensing output signal SAO is latched by the latch circuit 1120 to generate the output data DO.

Figure 17:
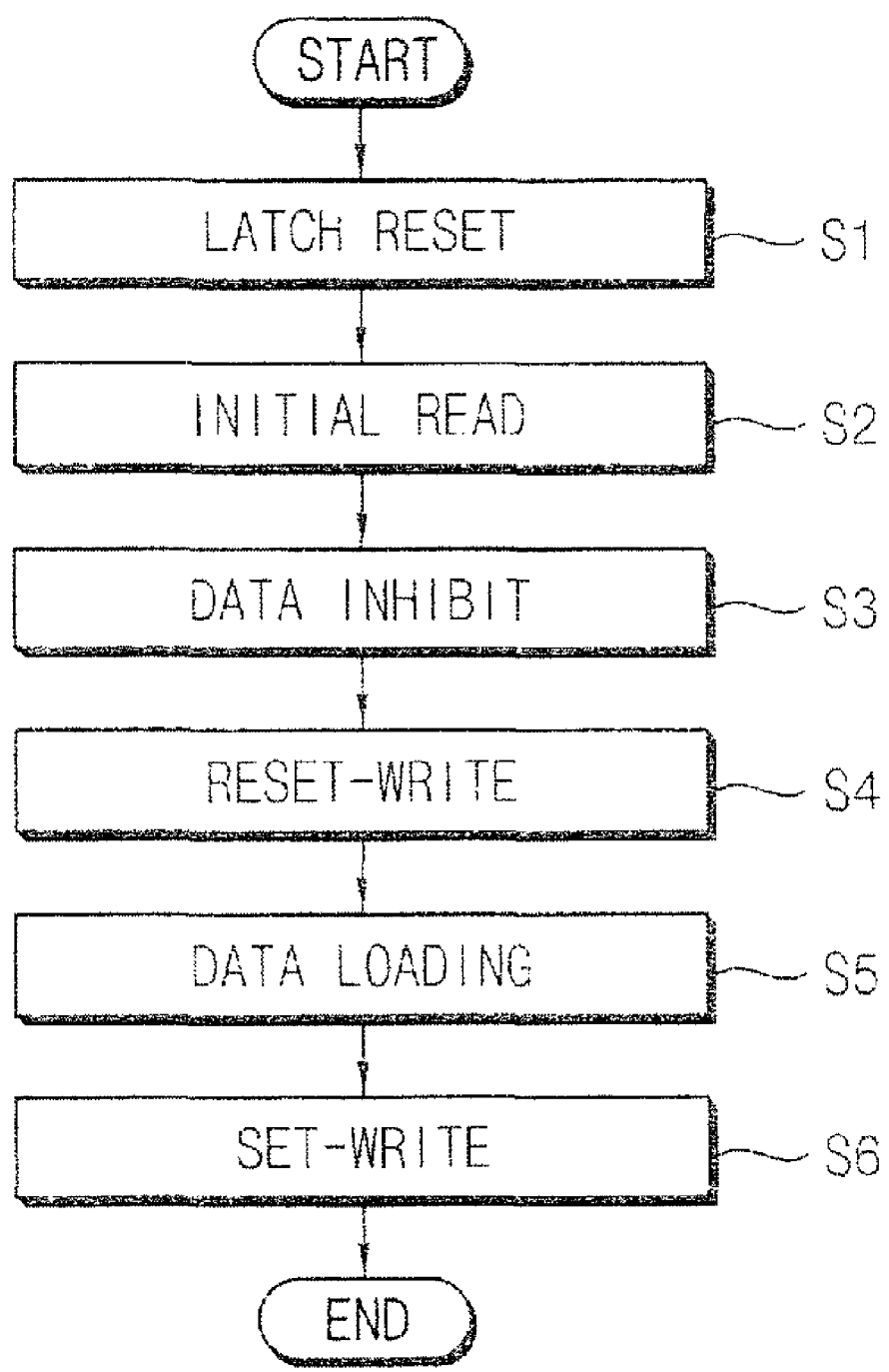
FIG. 17 is a flow chart illustrating a write operation of the resistive memory device of FIG. 1.

FIG. 17 is a flow chart illustrating a write operation of the resistive memory device of FIG. 1.

Referring to FIG. 17, the write operation may be performed by an operation of LATCH RESET (Block S1), an operation of INITIAL READ (Block S2), an operation of DATA INHIBIT (Block S3), an operation of RESET-WRITE (Block S4), an operation of DATA LOADING (Block S5), and an operation of SET_WRITE (Block S6). The operations of FIG. 17 will be described with reference to FIGS. 18 and 19.

Referring back to FIG. 1, the sensing voltage reference generator 1300 generates the sensing voltage reference SVR that has various voltage levels according to operation modes and operational conditions. The output circuit 1100 generates the sensing output signal SAO during the write operation by sensing the bitline voltage, and generates output data DO during the read operation by sensing the bitline voltage. The input circuit 1200 controls the bitline voltage based on the input data DI for the write operation, and limits the bitline voltage in response to the sensing output signal SAO during the write operation.

The resistive memory cell array 1700 may include memory cells as illustrated in FIGS. 2 through 5. If the resistive memory cell array 1700 includes the memory cells as illustrated in FIG. 4, the resistive memory device 1000 may be RRAM. If the resistive memory cell array 1700 includes the memory cells as illustrated in FIG. 5, the resistive memory device 1000 may be PRAM.

As illustrated in FIG. 6, the memory cell may have a state of relatively high resistance by the reset-write operation, and a state of relatively low resistance by the set-write operation. For example, the state of relatively high resistance may be defined as storing data "1", and the state of relatively low resistance may be defined as storing data "0".

The read operation of the resistive memory device 1000 has been described with reference to FIGS. 9 and 16. Hereinafter, the write operation of the resistive memory device 1000 will be further described with reference to FIGS. 9, 11, 17, 18 and 19.

Figure 18:
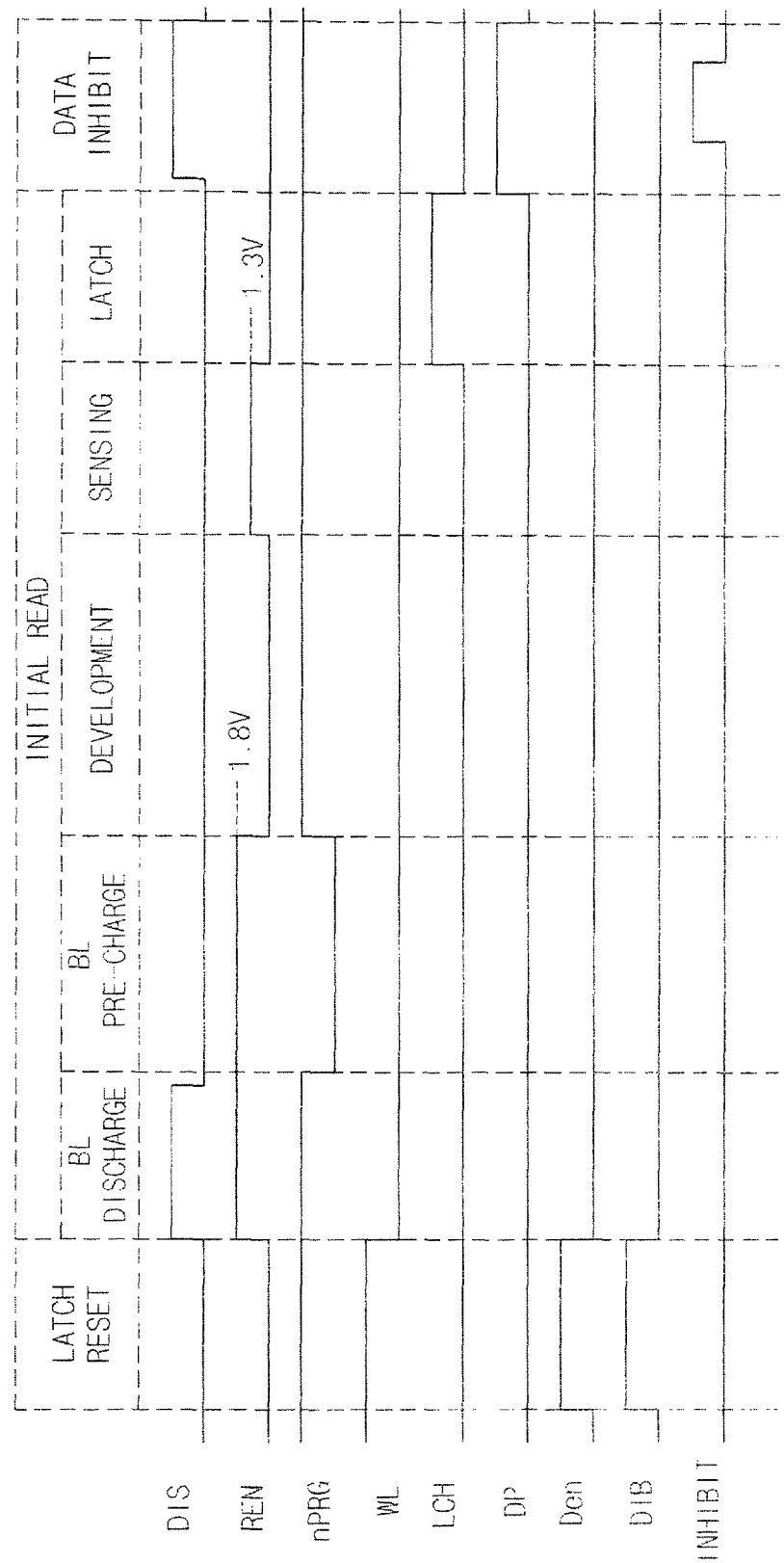
FIGS. 18 and 19 are timing diagrams illustrating a write operation of the resistive memory device of FIG. 1.
Figure 19:
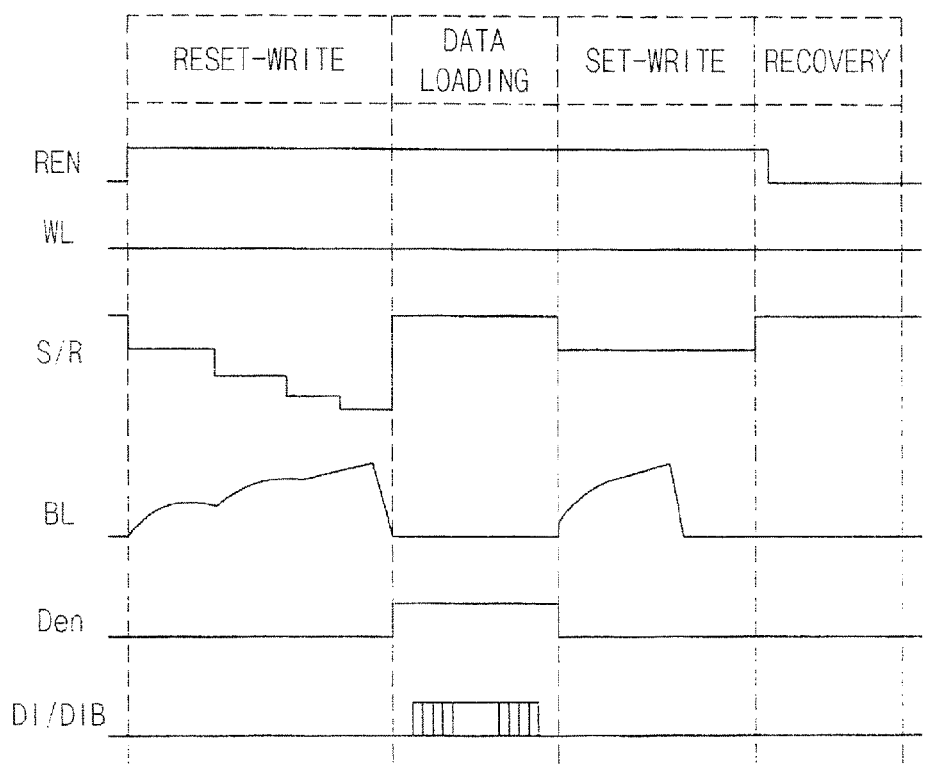

FIGS. 18 and 19 are timing diagrams illustrating a write operation of the resistive memory device of FIG. 1.

In the operation of LATCH RESET, the latch 1221 and 1222 in the input buffer 1220 is reset. Since the data enable signal Den is activated in logic high level and the inverted input data is logic high level, the node N1 becomes logic high level so that the driving transistor MP13 may be turned on.

In the operation of INITIAL READ, an initial read operation or a verification read operation is performed to read out the state of the memory cell coupled to the bitline BL. The initial read operation is similar to the read operation described with reference to FIG. 16, and thus repeated description is omitted. If the memory cell coupled to the bitline BL has the state of relatively high resistance, the sensing output signal SAO is logic high level after the initial read operation, and thus the feedback signal VFB becomes logic high level as described with reference to FIG. 10.

In the operation of DATA INHIBIT, the inhibit control signal INHIBIT is activated in logic high level to turn on the transistor 1232 in the inhibition circuit 1230. The transistor 1231 in the inhibition circuit 1230 is selectively turned on in response to the feedback signal. Thus the node N1 in the input buffer 1220 is set to logic low level to turn off the driving transistor MP13 when the feedback signal VFB after the initial read operation is logic high level. In contrast, the node N1 maintains logic high level that has been reset by the operation of LATCH RESET when the feedback signal VFB after the initial read operation is logic low level. As such unnecessary reset-write operation may be reduced or prevented to protect the memory cell coupled to the bitline BL when the memory cell is already in the reset state of relatively high resistance.

In the operation of RESET-WRITE, the reset-write operation is performed with respect to the memory cells having the state of relatively low resistance. As described above, the unnecessary reset-write operation is inhibited with respect to the memory cells having the state of relatively high resistance. During the reset-write operation, the read enable signal REN is activated in logic high level, the wordline voltage WL is logic low level, the data enable signal Den is deactivated in logic low level. The set-reset signal S/R may be sequentially decreased in response to the reference voltage control signal of FIG. 13, and thus the voltage of the bitline BL may be sequentially increased as illustrated in FIG. 19. After the reset-write operation, all the selected memory cells coupled to the respective bitlines are in the reset state of relatively high resistance.

In the operation of DATA LOADING, the data enable signal Den is activated in logic high level to turn of the transistor MN17 in the input buffer 1220, and the input data DI and the inverted input data DIB are applied to the gates of the transistors MN 15 and MN 16.

In the operation of SET-WRITE, the set-write operation is performed depending on the loaded data. When the loaded input data DO is "1", the driving transistor MP13 is turned off and the memory cell coupled to the bitline BL maintains the reset state of relatively high resistance. In contrast, when the loaded input data DO is "0", the driving transistor MP13 is turned on and the state of the memory cell is changed from the reset state of relatively high resistance to the set state of relatively low resistance. During the set-write operation, the read enable signal REN is activated in logic high level, the wordline voltage WL is logic low level, the data enable signal Den is deactivated in logic low level. The set-reset signal S/R may be higher during the set-write operation than during the reset-write operation, and thus the voltage of the bitline BL may be changed as illustrated in FIG. 19. After the set-write operation, the condition of the resistive memory device is recovered to the condition before the write operation except that the new data are stored in the memory cells according to the loaded input data DO. In the operation of RECOVERY, the read enable signal REN is deactivated in logic low level, the voltages of the wordline WL and the bitline are logic low level, the data enable signal Den is deactivated in logic low level, and the set-reset signal S/R has a high voltage level.

Figure 20:
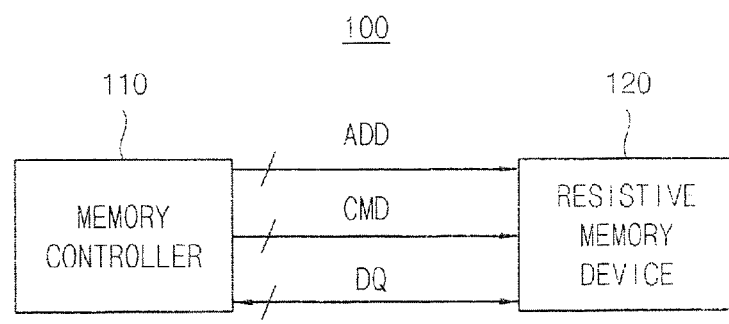
FIG. 20 is a block diagram illustrating a memory system including a resistive memory device according to example embodiments.

FIG. 20 is a block diagram illustrating a memory system including a resistive memory device according to example embodiments.

Referring to FIG. 20, a memory system 100 includes a memory controller 110 and a resistive memory device 120 according to any of the embodiments described herein.

The memory controller 110 generates an address signal ADD and command signals CMD, and provides the address signal ADD and the command signals CMD to the resistive memory device 120 through a bus. Data DQ indicates input data to be written into memory cells in the resistive memory device 120, or output data read from the memory cells in the resistive memory device 120.

The resistive memory device 120 may have a configuration described with reference to FIGS. 1 through 19. The resistive memory device 120 stores and outputs the data DQ in response to the address signal ADD and the command signals CMD. The resistive memory device 120 may include a resistive memory cell array, an output circuit and an input circuit as illustrated in FIG. 1. The resistive memory cell array includes a plurality of memory cells, and respective ones of the memory cells are coupled to a corresponding bitline. The output circuit generates a sensing output signal during a write operation by sensing a bitline voltage, and generates output data during a read operation by sensing the bitline voltage. The input circuit controls the bitline voltage based on input data for the write operation, and limits the bitline voltage in response to the sensing output signal during the write operation. The sensing reference voltage generator in the resistive memory device 120 may generate a sensing reference voltage SVR that has various voltage levels according to operation modes and operational conditions.

As described above, a resistive memory device according to example embodiments may adjust the sensing reference voltage SVR using the voltage limit control signal VL, the time limit control signal TL in addition to the location compensation control signal NF1 and NF2, thereby effectually limiting the bitline voltage. Also the resistive memory device may prevent unnecessary reset-write operation by the initial read operation. Accordingly, the memory cells may be protected from unnecessary and/or excessive bitline voltage, and thus reliability of the resistive memory device may be enhanced.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A resistive memory device comprising:
a resistive memory cell array including a plurality of resistive memory cells, respective ones of which are coupled to a corresponding bitline;
an output circuit configured to generate a sensing output signal during a write operation by sensing a bitline voltage, and configured to generate output data during a read operation by sensing the bitline voltage; and
an input circuit configured to control the bitline voltage based on input data for the write operation, and configured to receive the sensing output signal directly from the output circuit to limit the bitline voltage in response to the sensing output signal during the write operation,
wherein the input circuit is configured to limit a maximum voltage and/or a maximum time of a particular set pulse and/or reset pulse of the bitline voltage in response to the sensing output signal during the write operation;
the resistive memory device further comprising a sensing reference voltage generator configured to generate a sensing reference voltage that is compared with the bitline voltage by the output circuit to generate the sensing output signal,
wherein the sensing reference voltage generator is configured to adjust the sensing reference voltage in response to a location compensation control signal for compensating deviations due to respective locations of the resistive memory cells.

2. The resistive memory device of claim 1, wherein each resistive memory cell includes a resistive element and a switching element coupled thereto.

3. The resistive memory device of claim 2, wherein the resistive element includes a top electrode, a bottom electrode and transition-metal oxide between the top electrode and the bottom electrode.

4. The resistive memory device of claim 2, wherein the resistive element includes a phase change material having a resistance that is varied depending on temperature.

5. The resistive memory device of claim 1, wherein the input circuit includes a protection circuit configured to receive the sensing output signal directly from the output circuit to limit the bitline voltage in response to the sensing output signal during the write operation.

6. The resistive memory device of claim 1, wherein the sensing reference voltage generator is configured to adjust the sensing reference voltage in response to a voltage limit control signal during a reset-write operation of the write operation.

7. The resistive memory device of claim 1, wherein the sensing reference voltage generator is configured to adjust the sensing reference voltage in response to a time limit control signal during a set-write operation of the write operation.

8. A resistive memory device comprising:
a resistive memory cell array including a plurality of resistive memory cells, respective ones of which are coupled to a corresponding bitline;
an output circuit configured to generate a sensing output signal during a write operation by sensing a bitline voltage, and configured to generate output data during a read operation by sensing the bitline voltage; and
an input circuit configured to control the bitline voltage based on input data for the write operation, and configured to receive the sensing output signal directly from the output circuit to limit the bitline voltage in response to the sensing output signal during the write operation,
wherein the input circuit is configured to limit a maximum voltage and/or a maximum time of a particular set pulse and/or reset pulse of the bitline voltage in response to the sensing output signal during the write operation;
the resistive memory device further comprising a sensing reference voltage generator configured to generate a sensing reference voltage that is compared with the bitline voltage by the output circuit to generate the sensing output signal,
wherein the sensing reference voltage generator comprises:
an operational amplifier having a first input terminal receiving a reference voltage and a second input terminal coupled to a feedback node;
a field effect transistor of first conductivity type having a first controlled terminal coupled to a first reference voltage, a second controlled terminal for providing the sensing reference voltage and a gate coupled to an output terminal of the operational amplifier; and
a feedback circuit coupled between a second reference voltage and the second controlled terminal of the field effect transistor of first conductivity type, and configured to adjust a voltage of the feedback node in response to a voltage limit control signal, a time limit control signal and/or a location compensation control signal.

9. The resistive memory device of claim 8, wherein the feedback circuit comprises a plurality of resistors serially coupled to the feedback node and a plurality of field effect transistors of second conductivity type respectively coupled in parallel to each of the resistors, and the field effect transistors of second conductivity type are selectively turned on in response to the voltage limit control signal, the time limit control signal and/or the location compensation control signal to control the voltage of the feedback node.

10. A resistive memory device comprising:
a resistive memory cell array including a plurality of resistive memory cells, respective ones of which are coupled to a corresponding bitline;
an output circuit configured to generate a sensing output signal during a write operation by sensing a bitline voltage, and configured to generate output data during a read operation by sensing the bitline voltage; and
an input circuit configured to control the bitline voltage based on input data for the write operation, and configured to receive the sensing output signal directly from the output circuit to limit the bitline voltage in response to the sensing output signal during the write operation,
wherein the input circuit is configured to limit a maximum voltage and/or a maximum time of a particular set pulse and/or reset pulse of the bitline voltage in response to the sensing output signal during the write operation, and
wherein the output circuit comprises:
a field effect transistor having a first controlled terminal coupled to the bitline and a gate receiving a read enable signal;
a bitline precharge circuit coupled to a second controlled terminal of the field effect transistor, the bitline precharge circuit configured to precharge the bitline in response to a precharge control signal and to discharge the bitline in response to a discharge control signal while the read enable signal is activated;
a sense amplifier configured to compare the bitline voltage with a sensing reference voltage to generate the sensing output signal; and
a latch circuit configured to output an inversion signal of the sensing output signal as the output data during the read operation and to output the sensing output signal as a feedback signal during the write operation, in response to a latch control signal and a transfer control signal.

11. The resistive memory device of claim 10, wherein the sensing output signal is provided to the input circuit during the write operation to limit the bitline voltage.

12. A resistive memory comprising:
a resistive memory cell array including a plurality of resistive memory cells, respective ones of which are coupled to a corresponding bitline;
an output circuit configured to generate a sensing output signal during a write operation by sensing a bitline voltage, and configured to generate output data during a read operation by sensing the bitline voltage; and
an input circuit configured to control the bitline voltage based on input data for the write operation, and configured to receive the sensing output signal directly from the output circuit to limit the bitline voltage in response to the sensing output signal during the write operation,
wherein the input circuit is configured to limit a maximum voltage and/or a maximum time of particular set pulse and/or reset pulse of the bitline voltage in response to the sensing output signal during the write operation, and
wherein the input circuit comprises:
a protection circuit having a first terminal coupled to the bitline, the protection circuit configured to limit the bitline voltage in response to the sensing output signal;
a field effect transistor of first conductivity type having a first controlled terminal coupled to a second terminal of the protection circuit, the field effect transistor of first conductivity type configured to adjust a voltage applied to the bitline in response to a set-reset signal;
a driving transistor coupled between a driving voltage and a second controlled terminal of the field effect transistor of first conductivity type;
an input buffer configured to control the driving transistor in response to the input data; and
an inhibition circuit configured to control a latch in the input buffer in response to a feedback signal from the output circuit to turn off the driving transistor.

13. The resistive memory device of claim 12, wherein the protection circuit comprises a field effect transistor of second conductivity type coupled between the bitline and the field effect transistor of first conductivity type, the field effect transistor of the second conductivity type configured to turn off in response to the sensing output signal.

14. A method of controlling input and output operations of a resistive memory device including a plurality of resistive memory cells respectively coupled to a corresponding bitline, the method comprising:
generating a sensing output signal during a write operation by sensing a bitline voltage;
controlling the bitline voltage based on input data for the write operation;
limiting the bitline voltage in response to the sensing output signal during the write operation; and
generating output data during a read operation by sensing the bitline voltage,
wherein controlling the bitline voltage based on input data for the write operation comprises:
performing an initial read operation to generate a feedback signal indicating data stored in a corresponding memory cell;
performing an inhibit operation based on the feedback signal;
performing a reset-write operation based on a result of the inhibit operation; and
performing a set-write operation based on the input data.

* * * * *